United States Patent
Nakai et al.

(10) Patent No.: US 9,132,524 B2
(45) Date of Patent: *Sep. 15, 2015

(54) POLISHING PAD AND METHOD FOR PRODUCING SAME

(75) Inventors: Yoshiyuki Nakai, Osaka (JP); Kazuyuki Ogawa, Osaka (JP); Kenji Nakamura, Osaka (JP)

(73) Assignee: TOYO TIRE & RUBBER CO., LTD., Osaka (JP)

( * ) Notice: Subject to any disclaimer, the term of this patent is extended or adjusted under 35 U.S.C. 154(b) by 140 days.

This patent is subject to a terminal disclaimer.

(21) Appl. No.: 13/881,341

(22) PCT Filed: Oct. 26, 2010

(86) PCT No.: PCT/JP2010/068911
§ 371 (c)(1),
(2), (4) Date: Apr. 24, 2013

(87) PCT Pub. No.: WO2012/056513

PCT Pub. Date: May 3, 2012

(65) Prior Publication Data

US 2013/0217309 A1 Aug. 22, 2013

(51) Int. Cl.
*B24B 37/14* (2012.01)
*B24D 11/00* (2006.01)
(Continued)

(52) U.S. Cl.
CPC .............. *B24B 37/24* (2013.01); *H01L 21/304* (2013.01)

(58) Field of Classification Search
CPC ........ B24B 37/14; B24B 37/26; B24B 37/22; B24D 11/00; B24D 3/28

USPC ............... 451/41, 526, 534; 51/297–298; 521/155, 159, 170

See application file for complete search history.

(56) References Cited

U.S. PATENT DOCUMENTS 4,006,122 A * 2/1977 Chen et al. ................ 528/48
7,169,030 B1 * 1/2007 Kulp ........................ 451/527
(Continued)

FOREIGN PATENT DOCUMENTS

JP 2000-017252 A 1/2000
JP 2004-189820 A1 7/2004
(Continued)

OTHER PUBLICATIONS

An Office Action issued by the Korean Patent Office, mailed Jun. 23, 2014, for Korean related application No. 10-2013-7004551.
(Continued)

*Primary Examiner* — George Nguyen
(74) *Attorney, Agent, or Firm* — Law Office of Katsuhiro Arai

(57) ABSTRACT

A polishing pad has a polishing layer including a non-foamed polyurethane, wherein the non-foamed polyurethane is a reaction cured body of a polyurethane raw material composition containing an isocyanate-terminated prepolymer obtained by reacting a prepolymer raw material composition containing a diisocyanate, a high-molecular-weight polyol and a low-molecular-weight polyol; an isocyanate modified body polymerized by adding three or more diisocyanates; and a chain extender, and the addition amount of the isocyanate-modified body is 5 to 30 parts by weight with respect to 100 parts by weight of the isocyanate-terminated prepolymer. The polishing pad hardly causes scratches on the surface of an object to be polished and has an improved dressing property.

8 Claims, 2 Drawing Sheets

(51) Int. Cl.
*B24B 37/24* (2012.01)
*H01L 21/304* (2006.01)

(56) References Cited

U.S. PATENT DOCUMENTS

| | | | |
|---|---|---|---|
| 2005/0064709 A1* | 3/2005 | Shimomura et al. | 438/689 |
| 2006/0084365 A1 | 4/2006 | Sakurai et al. | |
| 2006/0229000 A1 | 10/2006 | Izumi et al. | |
| 2006/0280930 A1* | 12/2006 | Shimomura et al. | 428/304.4 |
| 2008/0085943 A1* | 4/2008 | Doura et al. | 521/110 |
| 2010/0003896 A1 | 1/2010 | Nakai et al. | |
| 2010/0015893 A1 | 1/2010 | Kazuno et al. | |
| 2010/0048102 A1 | 2/2010 | Nakai et al. | |
| 2014/0221594 A1* | 8/2014 | Duggal et al. | 528/54 |

FOREIGN PATENT DOCUMENTS

| | | |
|---|---|---|
| JP | 2006-110665 A | 4/2006 |
| JP | 2008-060360 A1 | 3/2008 |
| JP | 2008-080478 A1 | 4/2008 |
| JP | 4128606 B2 | 7/2008 |
| JP | 2008-238361 A | 10/2008 |
| TW | 200631999 A | 9/2006 |
| WO | 2011/056512 A1 | 5/2012 |

OTHER PUBLICATIONS

Taiwan Office Action with Search Report issued by Taiwan Patent Office, mailed on Jun. 18, 2013 for Taiwan counterpart application No. 099136736.

Taiwan Office Action with Search Report issued by the Taiwan Patent Office, mailed on Aug. 27, 2013 for Taiwan corresponding application No. 099136728.

An Office Action issued by the Korean Patent Office, mailed Jun. 23, 2014, for Korean counterpart application No. 10-2013-7004541.

Notification of Transmittal of Translation of the International Preliminary Report on Patentability (PCT/IB/338) mailed May 23, 2013, with International Preliminary Report on Patentability (PCT/IB/373) and Written Opinion of the International Searching Authority (PCT/ISA/237), for corresponding international application PCT/JP2010/068911.

A Notification of First Office Action issued by the State Intellectual Property Office of China, Issued Sep. 28, 2014, for Chinese counterpart application No. 201080069494.9.

A Notification of First Office Action issued by the State Intellectual Property Office of China, Issued Oct. 10, 2014, for a Chinese related application No. 201080069500.0.

* cited by examiner

POLISHING PAD AND METHOD FOR PRODUCING SAME

This application is the U.S. National Phase under 35 U.S.C. §371 of International Application PCT/JP2010/068911, filed Oct. 26, 2010. The International Application was published under PCT Article 21(2) in a language other than English.

TECHNICAL FIELD

The invention relates to a polishing pad capable of performing planarization of materials requiring a high surface planarity such as optical materials including a lens and a reflecting mirror, a silicon wafer, a glass substrate or an aluminum substrates for a hard disc and a product of general metal polishing with stability and a high polishing efficiency. A polishing pad of the invention is preferably employed, especially, in a planarization step of a silicon wafer or a device on which an oxide layer or a metal layer has been formed prior to further stacking an oxide layer or a metal layer thereon.

BACKGROUND ART

Typical materials requiring surface flatness at high level include a single-crystal silicon disk called a silicon wafer for producing semiconductor integrated circuits (IC, LSI). The surface of the silicon wafer should be flattened highly accurately in a process of producing IC. LSI etc., in order to provide reliable semiconductor connections for various coatings used in manufacturing the circuits. In the step of polishing finish, a polishing pad is generally stuck on a rotatable supporting disk called a platen, while a workpiece such as a semiconductor wafer is stuck on a polishing head. By movement of the two, a relative speed is generated between the platen and the polishing head while polishing slurry having abrasive grains is continuously supplied to the polishing pad, to effect polishing processing.

As polishing characteristics of a polishing pad, it is requested that a polished object is excellent in planarity and within wafer non-uniformity and a polishing rate is large. A planarity and within wafer non-uniformity of a polished object can be improved to some extent with a polishing layer higher in elastic modulus. A polishing rate can be bettered by increasing a holding quantity of a slurry on a foam with cells therein.

A polishing pad comprising a non-foamed synthetic resin or a polishing pad comprising a polyurethane foam has been proposed as a polishing pad satisfying the above properties (Patent Documents 1 and 2).

However, when a polishing pad comprising a foam is used, there is a problem such that scratches (flaws) are likely to occur on the surface to be polished of an object to be polished because the contact area between the object to be polished and the polishing pad becomes smaller and local surface pressure becomes higher.

On the other hand, when planarization process of a large number of semiconductor wafers is performed using a polishing pad, a fine uneven portion of the surface of the polishing pad is worn to deteriorate the performance of supplying a slurry to the processed surface of the semiconductor wafer, to decrease the polishing speed, or to worsen the planarization characteristics. Therefore, after having performed the planarization process of a predetermined number of semiconductor wafers, it is necessary to renew/roughen (dressing) the surface of the polishing pad using a dresser. When dressing is carried out for a predetermined period of time, uncountable fine uneven portions are produced on the surface of the polishing pad, so that the surface of the polishing pad becomes fluffy.

A conventional non-foamed polishing pad has a problem such that a cut rate is low at the time of dressing and such dressing takes too much time.

PRIOR ART DOCUMENTS

Patent Documents

Patent Document 1: JP-A-2006-110665
Patent Document 2: JP-B2-4128606

SUMMARY OF THE INVENTION

Problems to be Solved by the Invention

An objective of the present invention is to provide a polishing pad that hardly causes scratches on the surface of an object to be polished and has an improved dressing property, and a method for producing the same.

Means for Solving the Problems

As a result of investigations to solve the problems, the inventors have found that the objects can be achieved with the polishing pad described below, and have completed the invention.

That is, the present invention relates to a polishing pad having a polishing layer comprising a non-foamed polyurethane, wherein the non-foamed polyurethane is a reaction cured body of a polyurethane raw material composition containing:

an isocyanate-terminated prepolymer A obtained by reacting a prepolymer A raw material composition containing a diisocyanate, a high-molecular-weight polyol (a) and a low-molecular-weight polyol;

an isocyanate-terminated prepolymer B obtained by reacting a prepolymer B raw material composition containing an isocyanate-modified body polymerized by adding three or more diisocyanates and a high-molecular-weight polyol (b); and a chain extender; and the addition amount of the isocyanate-terminated prepolymer B is 5 to 30 parts by weight with respect to 100 parts by weight of the isocyanate-terminated prepolymer A.

The present invention is characterized by forming a polishing layer with a non-foamed polyurethane. It is possible to thereby effectively suppress the occurrence of scratches on the surface to be polished because the contact area between an object to be polished and a polishing layer becomes larger and surface pressure applied to the object to be polished becomes lower and uniform.

Further, the present inventors have found that the surface of the polishing pad is easily renewed because regular introduction of chemical crosslinking into a polymer (regular formation of a three-dimensional crosslinked structure) as a result of the reaction between the chain extender and a combination of the isocyanate-terminated prepolymer A and the isocyanate-terminated prepolymer B as the non-foamed polyurethane raw material makes the non-foamed polyurethane hard and brittle to allow the cut rate at the time of dressing to increase. Also, a chemically crosslinked network can be extended by using these two kinds of prepolymers. Thus, brittleness in the entire surface of the polishing layer can be made uniform, so that variation in abrasion can be suppressed. In addition, prepolymerization of the isocyanate-modified body serving as a three-dimensional crosslinking component makes adjustment of the molecular weight of the polyurethane easy, and this makes it possible to prevent excessive brittleness of the polyurethane and provide longer life of the pad.

The high-molecular-weight polyol (a) is preferably a polyether polyol having a number average molecular weight of 500 to 5000, and the diisocyanate is preferably toluene diisocyanate and dicyclohexylmethane diisocyanate. In addition, the high-molecular-weight polyol (b) is preferably a polyether polyol having a number average molecular weight of 250 to 2000, the isocyanate-modified body is preferably a hexamethylene diisocyanate-modified body of isocyanurate type and/or biuret type, and the isocyanate-terminated prepolymer B is preferably a prepolymer synthesized at an NCO index of 3.5 to 6.0 . By using these substances, a non-foamed polyurethane can be produced with good handleability and the effect of the present invention becomes more excellent.

It is necessary to add 5 to 30 parts by weight of the isocyanate-terminated prepolymer B with respect to 100 parts by weight of the isocyanate-terminated prepolymer A. When the addition amount of the isocyanate-terminated prepolymer B is less than 5 parts by weight, it becomes difficult to sufficiently make the non-foamed polyurethane brittle because the ratio of the chemical crosslinking in the polymer is insufficient. On the other hand, when it exceeds 30 parts by weight, scratches are likely to occur on the surface of the object to be polished because the ratio of the chemical crosslinking in the polymer becomes excessive and the hardness of the non-foamed polyurethane becomes too higher.

In addition, the non-foamed polyurethane has preferably an Asker D hardness of 65 to 80 degrees. When the Asker D hardness is less than 65 degrees, the planarity of the object to be polished tends to be reduced. On the other hand, when it is greater than 80 degrees, the planarity is good, but the in-plane uniformity of the object to be polished tends to be reduced. In addition, scratches are more likely to occur on the surface of the object to be polished.

Further, from the viewpoint of balance between renewability of the pad surface and life extension of the pad, the cut rate of the polishing pad of the present invention is preferably more than 1 μm/minute and 2 μm/minute or less.

Moreover, the present invention relates to a method for producing a polishing pad, comprising the steps of mixing a first component containing 5 to 30 parts by weight of an isocyanate-terminated prepolymer B obtained by reacting a prepolymer B raw material composition containing an isocyanate-modified body polymerized by adding three or more diisocyanates and a high-molecular-weight polyol (b) with respect to 100 parts by weight of an isocyanate-terminated prepolymer A obtained by reacting a prepolymer A raw material composition containing a diisocyanate, a high-molecular-weight polyol (a) and a low-molecular-weight polyol, with a second component containing a chain extender; and curing the mixture to prepare a non-foamed polyurethane.

The invention is also related to a method for manufacturing a semiconductor device, including the step of polishing a surface of a semiconductor wafer using the polishing pad.

MODE FOR CARRYING OUT THE INVENTION

Figure 1:
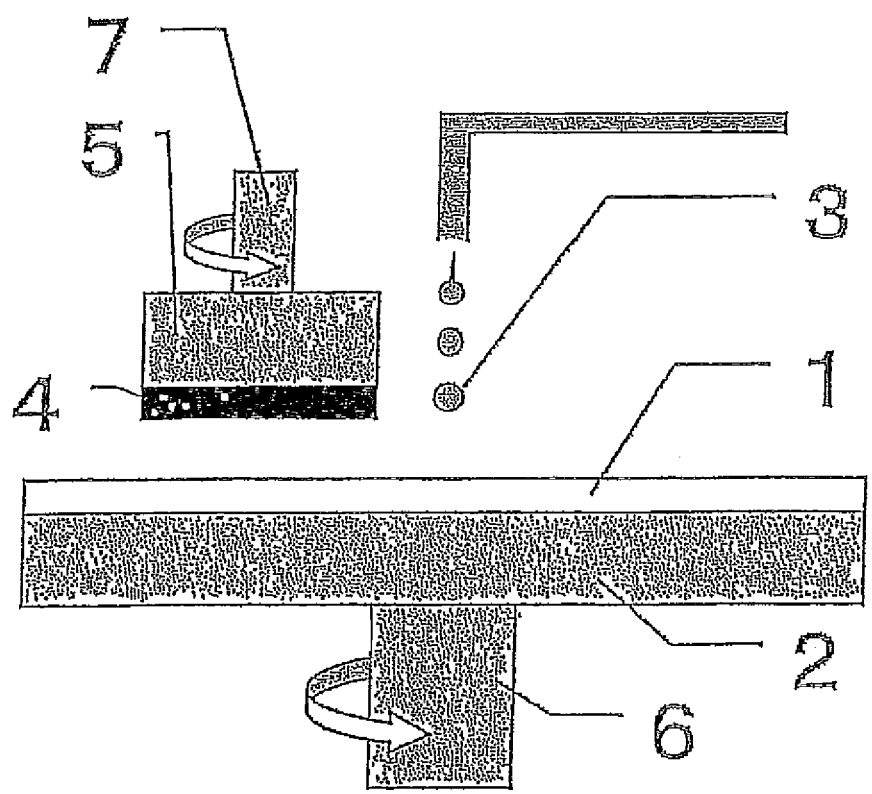
FIG. 1 is a schematic diagram showing a typical polishing apparatus for use in CMP polishing.

The polishing pad of the invention includes a polishing layer including a non-foamed polyurethane. The polishing pad of the invention may be only the polishing layer or a laminated body of the polishing layer and any other layer (such as a cushion layer).

Polyurethane is a preferred material for forming the polishing layer, because polyurethane is excellent in abrasion resistance and polymers with desired physical properties can be easily obtained by varying the raw material composition.

The non-foamed polyurethane is a reaction cured body of a polyurethane raw material composition containing an isocyanate-terminated prepolymer A obtained by reacting a prepolymer A raw material composition containing a diisocyanate, a high-molecular-weight polyol (a) and a low-molecular-weight polyol; an isocyanate-terminated prepolymer B obtained by reacting a prepolymer B raw material composition containing an isocyanate-modified body polymerized by adding three or more diisocyanates and a high-molecular-weight polyol (b); and a chain extender.

As the diisocyanate, a compound known in the field of polyurethane can be used without particular limitation. The isocyanate monomer includes, for example, aromatic diisocyanates such as 2,4-toluene diisocyanate, 2,6-toluene diisocyanate, 2,2'-diphenyl methane diisocyanate, 2,4'-diphenyl methane diisocyanate, 4,4'-diphenyl methane diisocyanate, 1,5-naphthalene diisocyanate, p-phenylene diisocyanate, m-phenylene diisocyanate, p-xylylene diisocyanate and m-xylylene diisocyanate, aliphatic diisocyanates such as ethylene diisocyanate, 2,2,4-trimethyl hexamethylene diisocyanate and 1,6-hexamethylene diisocyanate, and cycloaliphatic diisocyanates such as 1,4-cyclohexane diisocyanate, 4,4'-dicyclohexyl methane diisocyanate, isophorone diisocyanate and norbornane diisocyanate. These may be used alone or as a mixture of two or more thereof. Among the above isocyanate monomers, toluene diisocyanate and dicyclohexylmethane diisocyanate are preferably used in combination.

As used herein, the term 'isocyanate-modified body' refers to any of polymerized compounds produced by addition of three or more molecules of diisocyanate, or refers to a mixture of the compounds. For example, the isocyanate-modified body may be of (1) trimethylolpropane adduct type, (2) biuret type, (3) isocyanurate type, or the like. In particular, the isocyanurate type or the biuret type is preferred.

In the invention, the isocyanate-modified body is preferably produced using aliphatic diisocyanate, specifically 1,6-hexamethylene diisocyanate. The isocyanate-modified body may also be a modification such as a urethane-modified, allophanate-modified, or biuret-modified body.

As the high-molecular-weight polyol (a) and (b), those usually used in the art of polyurethane can be exemplified. Examples thereof include polyether polyols represented by polytetramethylene ether glycol and polyethylene glycol; polyester polyols represented by polybutylene adipate; polyester polycarbonate polyols exemplified by reaction products of polyester glycol such as polycaprolactone polyol or polycaprolactone and alkylene carbonate; polyester polycarbonate polyols obtained by reacting ethylene carbonate with polyvalent alcohol and the reacting the resultant reaction mixture with an organic dicarboxylic acid; and polycarbonate polyols obtained by ester exchange reaction between polyhydroxyl compound and aryl carbonate. These may be used singly or in combination of two or more kinds.

The number average molecular weight of the high-molecular-weight polyol (a) is not particularly limited, but it is preferably 500 to 5000, and more preferably 1000 to 2000. If the number average molecular weight is less than 500, the number of hard segment becomes too many, resulting in giving polyurethane with low toughness. On the other hand, if the number average molecular weight is more than 5000, the polyurethane becomes too soft and a polishing pad made from the polyurethane tends to have poor planarization properties.

The number average molecular weight of the high-molecular-weight polyol (b) is not particularly limited, but it is preferably 250 to 2000, and more preferably 250 to 650. If the number average molecular weight is less than 250, the abrasion resistance is reduced and the life extension of the pad tends to become difficult. On the other hand, if the number average molecular weight exceeds 2000, the renewability of the pad surface at the time of dressing tends to be deteriorated.

The low-molecular-weight polyol is an essential raw material for the isocyanate-terminated prepolymer A. Examples of the low-molecular-weight polyol include ethylene glycol, 1,2-propylene glycol, 1,3-propylene glycol, 1,2-butanediol, 1,3-butanediol, 1,4-butanediol, 2,3-butanediol, 1,6-hexanediol, neopentyl glycol, 1,4-cyclohexanedimethanol, 3-methyl-1,5-pentanediol, diethylene glycol, triethylene glycol, 1,4-bis(2-hydroxyethoxy)benzene, trimethylolpropane, glycerin, 1,2,6-hexanetriol, pentaerythritol, tetramethylolcyclohexane, methylglucoside, sorbitol, mannitol, dulcitol, sucrose, 2,2,6,6-tetrakis(hydroxymethyl)cyclohexanol, diethanolamine, N-methyldiethanolamine, and triethanolamine. One or more of these polyols may be used alone or in any combination. In addition, the low-molecular-weight polyol may also be used as a raw material for the isocyanate-terminated prepolymer B if necessary.

A low-molecular-weight polyamine such as ethylenediamine, tolylenediamine, diphenylmethanediamine, or diethylenetriamine may also be used as a raw material for the isocyanate-terminated prepolymer A and B concomitantly. An alcoholamine such as monoethanolamine, 2-(2-aminoethylamino)ethanol, or monopropanolamine may also be used concomitantly. These materials may be used alone or one or more of these may be used concomitantly.

The amount of the low-molecular-weight polyol, the low-molecular-weight polyamine, or the like is, although not limited particularly, preferably from 10 to 25% by mole, based on the amount of full active hydrogen group-containing compounds used as raw materials for the isocyanate-terminated prepolymer A, while it may be appropriately determined depending on the desired properties of the polishing pad (polishing layer) to be produced.

When the isocyanate-terminated prepolymer B is prepared, the isocyanate-modified body and the high-molecular-weight polyol (b) are preferably mixed in such a manner that the NCO index falls within the range of 3.5 to 6.0, more preferably within the range of 4.0 to 5.5.

A chain extender is an organic compound having at least two active hydrogen groups and examples of the active hydrogen group include: a hydroxyl group, a primary or secondary amino group, a thiol group (SH) and the like. Concrete examples of the chain extender include: polyamines such as 4,4'-methylenebis(o-chloroaniline) (MOCA), 2,6-dichloro-p-phenylenediamine, 4,4'-methylenebis(2,3-dichloroaniline), 3,5-bis(methylthio)-2,4-toluenediamine, 3,5-bis(methylthio)-2,6-toluenediamine, 3,5-diethyltoluene-2,4-diamine, 3,5-diethyltoluene-2,6-diamine, trimethylene glycol-di-p-aminobenzoate, polytetramethylene oxide-di-p-aminobenzoate, 4,4'-diamino-3,3',5,5'-tetraethyldiphenylmethane, 4,4'-diamino-3,3'-diisopropyl-5.5'-dimethyldiphenylmethane, 4,4'-diamino-3,3',5,5'-tetraisopropyldiphenylmethane, 1,2-bis(2-aminophenylthio)ethane, 4,4'-diamino-3,3'-diethyl-5.5'-dimethyldiphenylmethane, N,N'-di-sec-butyl-4,4'-diaminophenylmethane, 3,3'-diethyl-4,4'-diaminodiphenylmethane, m-xylylenediamine, N,N'-di-sec-butyl-p-phenylenediamine, m-phenylenediamine and p-xylylenediamine; the low-moleculer-weight polyol; and the low-molecular-weight polyamine. The chain extenders described above may be used either alone or in mixture of two kinds or more.

It is necessary to add 5 to 30 parts by weight, preferably 5 to 20 parts by weight, of the isocyanate-terminated prepolymer B with respect to 100 parts by weight of the isocyanate-terminated prepolymer A. Further, in order to obtain polishing pad having desired polishing properties, the number of isocyanate groups in the prepolymers is preferably from 0.8 to 1.2, more preferably from 0.99 to 1.15 per the number of active hydrogen groups (hydroxyl groups and/or amino groups) in the chain extender. If the number of isocyanate groups is outside the range, insufficient curing could occur so that the required specific gravity or hardness could not be achieved, which tends to decrease the polishing properties.

In addition, the isocyanate-terminated prepolymers A and B each having a number average molecular weight of about 1000 to 8000 are preferable because they have excellent processability, physical properties and the like.

The non-foamed polyurethane is preferably produced by melting method in view of cost, working environment and so on, while it may be produced by application of any known urethane foaming techniques such as melting method and solution technique. Various additives may be mixed; such as a stabilizer including an antioxidant, a lubricant, a pigment, a filler, an antistatic agent and others.

A known catalyst promoting polyurethane reaction, such as tertiary amine-based catalysts, may be used. The type and amount of the catalyst added are determined in consideration of flow time in casting in a predetermined mold after the mixing step.

Production of the non-foamed polyurethane may be in a batch system where each component is weighed out, introduced into a vessel and mixed or in a continuous production system where each component is continuously supplied to, and stirred in, a stirring apparatus and a polyurethane raw material composition is transfered to produce molded articles.

A manufacturing method of a polishing pad may be performed in ways: in one of which an isocyanate-terminated prepolymer A and B (a first component) are put into a reaction vessel, thereafter a chain extender (a second component) is mixed into the reaction vessel, the mixtue is agitated, thereafter the mixture is cast into a mold with a predetermined size to thereby prepare a block and the block is sliced with a slicer like a planer or a band saw; and in another of which in the step of casting into the mold, a thin sheet may be directly produced. Besides, a still another way may be adopted in which a resin of raw material is melted, the melt is extruded through a T die to thereby mold a non-foamed polyurethane directly in the shape of a sheet.

The non-foamed polyurethane has preferably an Asker D hardness of 65 to 80 degrees, and more preferably 70 to 75 degrees.

A polishing pad (polishing layer) of the invention is preferably provided with a depression and a protrusion structure for holding and renewing a slurry. Though in a case where the polishing layer is formed with a non-foamed body, which lacks in work to hold and renew the slurry, a depression and protrusion structure are preferably provided on the surface of the polishing side thereof in order to achieve more of holdability and renewal of the slurry or in order to prevent induction of dechuck error or breakage of an object to be polished. The shape of the depression and protrusion structure is not particularly limited insofar as slurry can be retained and renewed, and examples include latticed grooves, concentric circle-shaped grooves, through-holes, non-through-holes, polygonal prism, cylinder, spiral grooves, eccentric grooves, radial grooves, and a combination of these grooves. The groove pitch, groove width, groove thickness etc. are not particularly limited either, and are suitably determined to form grooves. These depression and protrusion structure are generally those having regularity, but the groove pitch, groove width, groove depth etc. can also be changed at each certain region to make retention and renewal of slurry desirable.

The method of forming the depression and protrusion structure is not particularly limited, and for example, formation by mechanical cutting with a jig such as a bite of predetermined size, formation by casting and curing resin in a mold having a specific surface shape, formation by pressing resin with a pressing plate having a specific surface shape, formation by photolithography, formation by a printing means, and formation by a laser light using a $CO_2$ gas laser or the like.

No specific limitation is placed on a thickness of a polishing layer, but a thickness thereof is about 0.8 to 4 mm, preferably 1.5 to 2.5 mm. The method of preparing the polishing layer of this thickness includes a method wherein a block of the non-foamed polyurethane is cut in predetermined thickness by a slicer in a bandsaw system or a planing system, a method that involves casting resin into a mold having a cavity of predetermined thickness and curing the resin, a method of using coating techniques and sheet molding techniques, etc.

The scatter of the thickness of the polishing layer is preferably 100 µm or less. When the scatter of the thickness is higher than 100 µm, large undulation is caused to generate portions different in a contacting state with an object to be polished, thus adversely influencing polishing characteristics. To solve the scatter of the thickness of the polishing layer, the surface of the polishing layer is dressed generally in an initial stage of polishing by a dresser having abrasive grains of diamond deposited or fused thereon, but the polishing layer outside of the range described above requires a longer dressing time to reduce the efficiency of production.

As a method of suppressing the scatter of thickness, there is also a method of buffing the surface of the polishing layer having a predetermined thickness. Buffing is conducted preferably stepwise by using polishing sheets different in grain size.

A polishing pad of the invention may also be a laminate of a polishing layer and a cushion layer adhered to each other.

The cushion layer compensates for characteristics of the polishing layer. The cushion layer is required for satisfying both planarity and uniformity which are in a tradeoff relationship in CMP. Planarity refers to flatness of a pattern region upon polishing an object to be polished having fine unevenness generated upon pattern formation, and uniformity refers to the uniformity of the whole of an object to be polished. Planarity is improved by the characteristics of the polishing layer, while uniformity is improved by the characteristics of the cushion layer. The cushion layer used in the polishing pad of the present invention is preferably softer than the polishing layer.

The material forming the cushion layer is not particularly limited, and examples of such material include a nonwoven fabric such as a polyester nonwoven fabric, a nylon nonwoven fabric or an acrylic nonwoven fabric, a nonwoven fabric impregnated with resin such as a polyester nonwoven fabric impregnated with polyurethane, polymer resin foam such as polyurethane foam and polyethylene foam, rubber resin such as butadiene rubber and isoprene rubber, and photosensitive resin.

Means for adhering the polishing layer to the cushion layer include: for example, a method in which a double sided tape is sandwiched between the polishing layer and the cushion layer, followed by pressing.

The double sided tape is of a common construction in which adhesive layers are provided on both surfaces of a substrate such as a nonwoven fabric or a film. It is preferable to use a film as a substrate with consideration given to prevention of permeation of a slurry into a cushion layer. A composition of an adhesive layer is, for example, of a rubber-based adhesive, an acrylic-based adhesive or the like. An acrylic-based adhesive is preferable because of less of a content of metal ions, to which consideration is given. Since a polishing layer and a cushion layer is sometimes different in composition from each other, different compositions are adopted in respective adhesive layers of double sided tape to thereby also enable adhesive forces of the respective adhesive layers to be adjusted to proper values.

A polishing pad of the invention may be provided with a double sided tape on the surface of the pad adhered to a platen. As the double sided tape, a tape of a common construction can be used in which adhesive layers are, as described above, provided on both surfaces of a substrate. As the substrate, for example, a nonwoven fabric or a film is used. Preferably used is a film as a substrate since separation from the platen is necessary after the use of a polishing pad. As a composition of an adhesive layer, for example, a rubber-based adhesive or an acrylic-based adhesive is exemplified. Preferable is an acrylic-based adhesive because of less of metal ions in content to which consideration is given.

A semiconductor device is fabricated after operation in a step of polishing a surface of a semiconductor wafer with a polishing pad. The term, a semiconductor wafer, generally means a silicon wafer on which a wiring metal and an oxide layer are stacked. No specific limitation is imposed on a polishing method of a semiconductor wafer or a polishing apparatus, and polishing is performed with a polishing apparatus equipped, as shown in FIG. 1, with a polishing platen 2 supporting a polishing pad (a polishing layer) 1, a polishing head 5 holding a semiconductor wafer 4, a backing material for applying a uniform pressure against the wafer and a supply mechanism of a polishing agent 3. The polishing pad 1 is mounted on the polishing platen 2 by adhering the pad to the platen with a double sided tape. The polishing platen 2 and the polishing head 5 are disposed so that the polishing pad 1 and the semiconductor wafer 4 supported or held by them oppositely face each other and provided with respective rotary shafts 6 and 7. A pressure mechanism for pressing the semiconductor wafer 4 to the polishing pad 1 is installed on the polishing head 5 side. During polishing, the semiconductor wafer 4 is polished by being pressed against the polishing pad 1 while the polishing platen 2 and the polishing head 5 are rotated and a slurry is fed. No specific limitation is placed on a flow rate of the slurry, a polishing load, a polishing platen rotation number and a wafer rotation number, which are properly adjusted.

Protrusions on the surface of the semiconductor wafer 4 are thereby removed and polished flatly. Thereafter, a semiconductor device is produced therefrom through dicing, bonding, packaging etc. The semiconductor device is used in an arithmetic processor, a memory etc.

EXAMPLES

Description will be given of the invention with examples, while the invention is not limited to description in the examples.

[Measurement and Evaluation Method]
(Measurement of Number-Average Molecular Weight)

A number-average molecular weight was measured by GPC (a Gel Permeation Chromatography) and a value as measured was converted in terms of standard polystylene molecular weight, and the apparatus and conditions in operation were as follows:

GPC apparatus was an apparatus manufactured by Shimadzu Corp., with Model Number of LC-10A.

Columns that were used in measurement were ones manufactured by Polymer Laboratories Co., in which three columns were in connection including (PL gel, 5 μm and 500 Å), (PL gel, 5 μm and 100 Å) and (PL gel, 5 μm and 50 Å).

A flow rate was 1.0 ml/min.
A concentration was 1.0 g/l.
An injection quantity was 40 μl.
A column temperature was 40° C.
An eluent was tetrahydrofuran.

(Measurement of Specific Gravity)

Determined according to JIS Z8807-1976. A manufactured non-foamed polyurethane and a manufactured polyurethane foam cut out in the form of a strip of 4 cm×8.5 cm (thickness: arbitrary) was used as a sample for measurement of specific gravity and left for 16 hours in an environment of a temperature of 23±2° C. and a humidity of 50%±5%. Measurement was conducted by using a specific gravity hydrometer (manufactured by Sartorius Co., Ltd).

(Measurement of Hardness)

Measurement is conducted according to JIS K6253-1997. A manufactured non-foamed polyurethane and a manufactured polyurethane foam cut out in a size of 2 cm×2 cm (thickness: arbitrary) was used as a sample for measurement of hardness and left for 16 hours in an environment of a temperature of 23±2° C. and a humidity of 50%±5%. At the time of measurement, samples were stuck on one another to a thickness of 6 mm or more. A hardness meter (Asker D hardness meter, manufactured by Kobunshi Keiki Co., Ltd.) was used to measure hardness.

(Measurement of Surface Roughness Distribution)

A prepared polishing pad was bonded to a platen of a polishing apparatus (SPP600S, manufactured by Okamoto Machine Tool Works, Ltd.). Using a dresser (M type, manufactured by Asahi Diamond Industrial Co., Ltd.), the surface of a polishing layer was dressed under the conditions of a dressing pressure of 50 g/cm$^2$, a platen rotation speed of 35 rpm, a water flow of 200 ml/minute, and a dressing time of 30 minutes. After completion of the dressing, at the central position in the radial direction of the polishing pad, three samples (20 mm×20 mm) were cut at intervals of 120°. Using a stylus profilometer (P-15, manufactured by KLA Tencor Japan Ltd.), each surface roughness of the three samples was measured once and each three-dimensional square root roughness Sq (μm) of the surface was calculated. Then the mean value of the Sq values of the three samples (mean Sq value) was calculated. The mean Sq value is preferably 6 to 9 μm. The three-dimensional square root roughness Sq is determined by the following expression when the XY plane represents the average plane, the Z-axis represents the vertical direction, and the measured curve of surface shape is expressed by z=f(x,y):

$$Sq = \sqrt{\frac{1}{L_x L_y} \int_0^{L_x} \int_0^{L_y} f^2(x,y) dx dy}$$ [Mathematical expression 1]

wherein Lx is a measuring length in the x-direction, and Ly is a measuring length in the y-direction.

Measurement conditions
Measurement area: 500 μm×500 μm (measuring length 500 μm)
Scanning speed: Scan pitch 20 μm/second
Trace: 51 (10 μm pitch)
Measurement load: 2 mg (Measurement of Cut Rate)

A prepared polishing pad was bonded to a platen of a polishing apparatus (SPP600S, manufactured by Okamoto Machine Tool Works, Ltd.). Using a dresser (M type, manufactured by Asahi Diamond Industrial Co., Ltd.), the surface of a polishing layer was dressed under the conditions of a dressing load of 9.7 lbf, a dressing pressure of 50 g/cm$^2$, a platen rotation speed of 35 rpm, a water flow of 200 ml/minute, and a dressing time of 30 minutes. After completion of the dressing, a strip sample (20 mm in width×610 mm in length) was cut out therefrom. The thickness of the sample was measured at points spaced at intervals of 20 mm from the central part (15 points on one side, 30 points in total). The difference (abrasion loss) between the thickness of non-dressed central part and the thickness of each measurement point was calculated, and then the average of the differences was calculated. The cut rate is calculated from the following equation. In the present invention, the cut rate is preferably more than 1 μm/minute and 2 μm/minute or less, and more preferably 1.1 to 1.7 μm/minute.

Cut rate (μm/minute)=average of abrasion loss/(0.5×60)

(Evaluation of Scratches)

Evaluation of scratches was carried out by using a polishing apparatus SPP600S (manufactured by Okamoto Machine Tool Works, Ltd.) with use of a prepared polishing pad. After polishing an 8-inch silicon wafer having a 1 μm-thick thermal oxide film formed thereon under the following conditions, the number of defects of 0.19 to 2 μm in the wafer was measured at an EE (edge exclusion) of 5 mm by using a surface defect detector (Surf Scan SP1 TBI, manufactured by KLA-Tencor Japan, Ltd.). The polishing conditions were as follows: a silica slurry (SS12, manufactured by Cabot) was added at a flow rate of 150 ml/minute during polishing, the polishing load was 350 g/cm$^2$, the polishing platen rotation speed was 35 rpm, and the wafer rotation speed was 30 rpm.

(Measurement of Average Polishing Speed)

Figure 2:
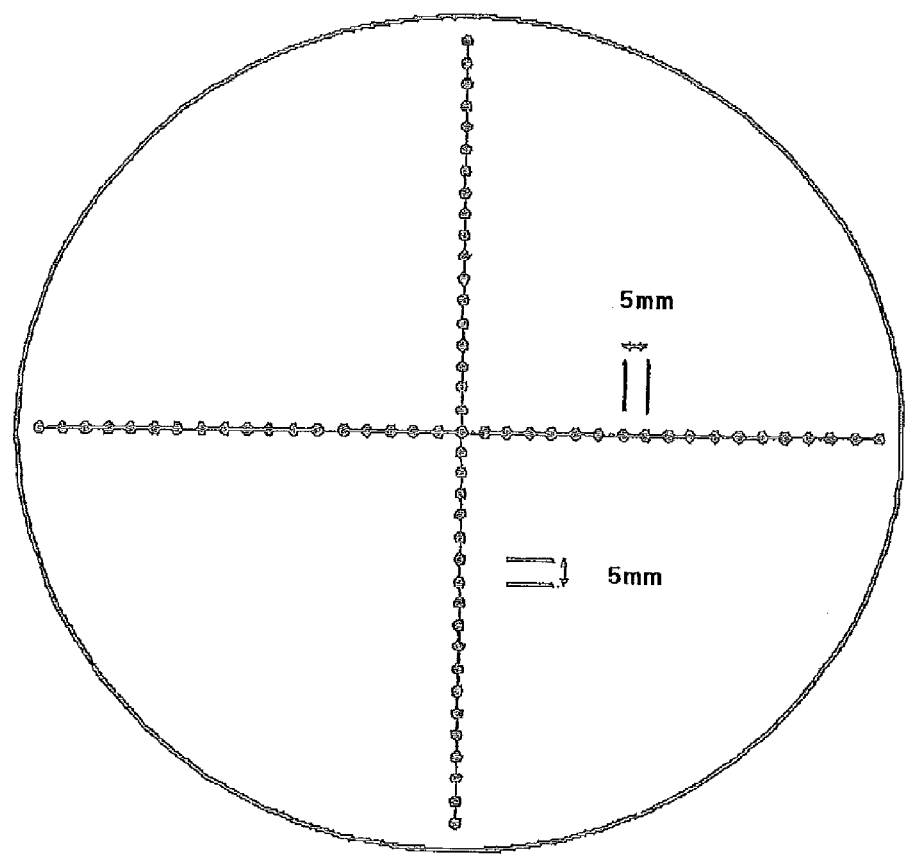
FIG. 2 is a schematic diagram showing 73 points on a wafer at each of which the film thickness is measured.

Measurement of average polishing speed was carried out by using a polishing apparatus SPP600S (manufactured by Okamoto Machine Tool Works, Ltd.) with use of a prepared polishing pad. An 8-inch silicon wafer having a 1 μm-thick thermal oxide film formed thereon was polished for one minute under the following conditions. As shown in FIG. 2, average polishing speed was calculated from the film thickness measured at specific 73 points on the wafer after the polishing. The thickness of the oxide film was measured with use of an interference type film thickness measuring apparatus (manufactured by Otsuka Electronics Co., Ltd.). The polishing conditions were as follows: a silica slurry (SS12, manufactured by Cabot) was added at a flow rate of 150 ml/minute during polishing, the polishing load was 350 g/cm$^2$, the polishing platen rotation speed was 35 rpm, and the wafer rotation speed was 30 rpm.

Example 1

To a vessel were added 1229 parts by weight of toluene diisocyanate (a mixture of toluene 2,4-diisocyanate/toluene 2,6-diisocyanate=80/20), 272 parts by weight of 4,4'-dicyclohexylmethane diisocyanate, 1901 parts by weight of polytetramethylene ether glycol with a number average molecular weight of 1018, and 198 parts by weight of diethylene glycol, and the mixture was allowed to react at 70° C. for 4 hours to obtain an isocyanate-terminated prepolymer A.

In addition, to a vessel were added 100 parts by weight of a polymerized 1,6-hexamethylene diisocyanate (Sumijule N-3300 (isocyanurate type) manufactured by Sumika Bayer Urethane Co., Ltd.) as an isocyanate-modified body and 16.3 parts by weight of polytetramethylene ether glycol with a number average molecular weight of 250 (NCO index: 4.0), and the mixture was allowed to react at 100° C. for 3 hours to obtain an isocyanate-terminated prepolymer B(1).

One hundred parts by weight of the prepolymer A and 16 parts by weight of the prepolymer B(1) were mixed in a planetary mixing and defoaming apparatus and defoamed. After that, 33.1 parts by weight of 4,4'-methylenebis(o-chloroaniline) which had been previously melted at 120° C. was added to the mixture and mixed in a planetary mixing and defoaming apparatus, and then defoamed to prepare a polyurethane raw material composition. The composition was poured into an open mold (800 mm in length and width and 2.5 mm in depth) (casting vessel) and post curing was performed at 100° C. for 16 hours to obtain a non-foamed polyurethane sheet. The surface of the sheet was then buffed with a buffing machine (manufactured by AMITEC) until the sheet had a thickness of 1.27 mm. As a result, the sheet had adjusted thickness accuracy. The buffed sheet was punched out to form a disc with a diameter of 61 cm, and processing of concentric circular grooves each with a width of 0.25 mm and a depth of 0.40 mm at a groove pitch of 1.50 mm was performed on the surface of the sheet using a grooving machine (manufactured by Techno) so that a polishing layer was obtained. A double-faced adhesive tape (Double Tack Tape manufactured by SEKISUI CHEMICAL CO., LTD.) was bonded to the surface of the polishing layer opposite to the grooved surface using a laminator. The surface of a corona-treated cushion layer (Toraypef (0.8 mm-thick polyethylene foam), manufactured by Toray Industries, Inc.) was buffed. The buffed cushion layer was bonded to the double-faced adhesive tape using a laminator. Another double-faced adhesive tape was also bonded to the other side of the cushion sheet using a laminator so that a polishing pad was prepared.

Example 2

A polishing pad was prepared in the same manner as in Example 1, except that in Example 1, the addition amount of the prepolymer B(1) was changed to 8 parts by weight from 16 parts by weight, and the addition amount of 4,4'-methylenebis(o-chloroaniline) was changed to 29.8 parts by weight from 33.1 parts by weight.

Example 3

To a vessel were added 100 parts by weight of a polymerized 1,6-hexamethylene diisocyanate (Sumijule N-3300 (isocyanurate type) manufactured by Sumika Bayer Urethane Co., Ltd.) as an isocyanate-modified body and 42.4 parts by weight of polytetramethylene ether glycol with a number average molecular weight of 650 (NCO index: 4.0), and the mixture was allowed to react at 100° C. for 3 hours to obtain an isocyanate-terminated prepolymer B(2).

A polishing pad was prepared in the same manner as in Example 1, except that in Example 1, 16 parts by weight of the prepolymer B(2) was used in place of 16 parts by weight of the prepolymer B(1), and addition amount of 4,4'-methylenebis(o-chloroaniline) was changed to 31.9 parts by weight from 33.1 parts by weight.

Example 4

To a vessel were added 100 parts by weight of a polymerized 1,6-hexamethylene diisocyanate (Sumijule N-3300 (isocyanurate type) manufactured by Sumika Bayer Urethane Co., Ltd.) as an isocyanate-modified body and 39.1 parts by weight of polyethylene glycol with a number average molecular weight of 600 (NCO index: 4.0), and the mixture was allowed to react at 100° C. for 3 hours to obtain an isocyanate-terminated prepolymer B(3).

A polishing pad was prepared in the same manner as in Example 1, except that in Example 1, 16 parts by weight of the prepolymer B(3) was used in place of 16 parts by weight of the prepolymer B(1), and the addition amount of 4,4'-methylenebis(o-chloroaniline) was changed to 32.0 parts by weight from 33.1 parts by weight.

Comparative Example 1

A polishing pad was prepared in the same manner as in Example 1, except that in Example 1, the prepolymer B(1) was not added and the addition amount of 4,4'-methylenebis(o-chloroaniline) was changed to 26.6 parts by weight from 33.1 parts by weight.

Comparative Example 2

A polishing pad was prepared in the same manner as in Example 1, except that in Example 1, the addition amount of the prepolymer B (1) was changed to 35 parts by weight from 16 parts by weight, and the addition amount of 4,4'-methylenebis(o-chloroaniline) was changed to 38.5 parts by weight from 33.1 parts by weight.

Comparative Example 3

To a polymerization vessel were added 100 parts by weight of the prepolymer A, 23.3 parts by weight of the prepolymer B(1), and 3.7 parts by weight of a silicone-based surfactant (SH-192, manufactured by Dow Corning Toray Silicone Co., Ltd.) followed by mixing, and the mixture was adjusted to 80° C., and then defoamed at reduced pressure. The mixture was then vigorously agitated at a rotation number of 900 rpm for about 4 minutes with agitation blades so that bubbles were incorporated into the reaction system. To the reaction system was added 36.1 parts by weight of 4,4'-methylenebis(o-chloroaniline) that had been melted at 120° C. in advance. The mixture was agitated for about 70 seconds and then poured into a pan type open mold (casting vessel). When the mixed solution lost fluidity, it was put into an oven and post curing was performed at 100° C. for 16 hours to obtain a polyurethane foam block. The polyurethane foam block heated to about 80° C. was sliced with a slicer (VGW-125, manufactured by AMITEC) to obtain a polyurethane foam sheet. The surface of the sheet was then buffed with a buffing machine (manufactured by AMITEC) until the sheet had a thickness of 1.27 mm. As a result, the sheet had adjusted thickness accuracy. The buffed sheet was punched out to form a disc with a diameter of 61 cm, and processing of concentric circular grooves each with a width of 0.25 mm and a depth of 0.40 mm at a groove pitch of 1.50 mm was performed on the surface of the sheet using a grooving machine (manufactured by Techno) so that a polishing layer was obtained. Then, a polishing pad was prepared in the same manner as in Example 1.

TABLE 1

|  | Specific gravity | D hardness (degree) | Three dimensional square root roughness Mean Sq value (μm) | Cut rate (μm/minute) | Scratch (number) | Average polishing speed (angstrom/minute) |
|---|---|---|---|---|---|---|
| Example 1 | 1.1 | 73.0 | 8.0 | 1.5 | 42 | 2150 |
| Example 2 | 1.1 | 70.5 | 7.0 | 1.3 | 48 | 2100 |
| Example 3 | 1.1 | 70.0 | 7.0 | 1.4 | 19 | 2100 |
| Example 4 | 1.1 | 71.0 | 7.5 | 1.45 | 27 | 2200 |
| Comparative Example 1 | 1.1 | 69.0 | 5.1 | 0.8 | 73 | 1800 |
| Comparative Example 2 | 1.1 | 81.0 | 5.6 | 3.3 | 305 | 1850 |
| Comparative Example 3 | 0.86 | 59.0 | 11.5 | 2.1 | 80 | 2100 |

DESCRIPTION OF REFERENCE SIGNS

1: Polishing pad (polishing layer)
2: Polishing platen
3: Polishing agent (slurry)
4: Object to be polished (semiconductor wafer)
5: Supporting stand (polishing head)
6, 7: Rotary shaft

The invention claimed is:

1. A polishing pad having a polishing layer comprising a non-foamed polyurethane, wherein
the non-foamed polyurethane is a reaction cured body of a polyurethane raw material composition containing:
an isocyanate-terminated prepolymer A obtained by reacting a prepolymer A raw material composition containing a diisocyanate, a high-molecular-weight polyol (a) and a low-molecular-weight polyol;
an isocyanate-terminated prepolymer B obtained by reacting a prepolymer B raw material composition containing an isocyanate-modified body polymerized by adding three or more diisocyanates and a high-molecular-weight polyol (b); and
a chain extender; and
the addition amount of the isocyanate-terminated prepolymer B is 5 to 30 parts by weight with respect to 100 parts by weight of the isocyanate-terminated prepolymer A.

2. The polishing pad according to claim 1, wherein the high-molecular-weight polyol (a) is a polyether polyol having a number average molecular weight of 500 to 5000 and the diisocyanate is toluene diisocyanate and dicyclohexylmethane diisocyanate.

3. The polishing pad according to claim 1, wherein the high-molecular-weight polyol (b) is a polyether polyol having a number average molecular weight of 250 to 2000, the isocyanate-modified body is a hexamethylene diisocyanate-modified body of isocyanurate type and/or biuret type, and the isocyanate-terminated prepolymer B is a prepolymer synthesized at an NCO index of 3.5 to 6.0.

4. The polishing pad according to claim 1, wherein the non-foamed polyurethane has an Asker D hardness of 65 to 80 degrees.

5. The polishing pad according to claim 1, wherein a cut rate which is a dressed amount (μm) per minute of the polishing layer by dressing the polishing layer is more than 1 μm/minute and 2 μm/minute or less.

6. A method for producing a polishing pad, comprising the steps of mixing a first component containing 5 to 30 parts by weight of an isocyanate-terminated prepolymer B obtained by reacting a prepolymer B raw material composition containing an isocyanate-modified body polymerized by adding three or more diisocyanates and a high-molecular-weight polyol (b) with respect to 100 parts by weight of an isocyanate-terminated prepolymer A obtained by reacting a prepolymer A raw material composition containing a diisocyanate, a high-molecular-weight polyol (a) and a low-molecular-weight polyol, with a second component containing a chain extender; and curing the mixture to prepare a non-foamed polyurethane.

7. A method for producing a semiconductor device, comprising the step of polishing the surface of a semiconductor wafer by using the polishing pad according to claim 1.

8. The polishing pad according to claim 2, wherein the high-molecular-weight polyol (b) is a polyether polyol having a number average molecular weight of 250 to 2000, the isocyanate-modified body is a hexamethylene diisocyanate-modified body of isocyanurate type and/or biuret type, and the isocyanate-terminated prepolymer B is a prepolymer synthesized at an NCO index of 3.5 to 6.0.

\* \* \* \* \*